United States Patent
Prejbeanu et al.

(10) Patent No.: US 10,002,973 B2
(45) Date of Patent: Jun. 19, 2018

(54) MAGNETIC TUNNEL JUNCTION WITH AN IMPROVED TUNNEL BARRIER

(75) Inventors: Ioan Lucian Prejbeanu, Seyssinet Pariset (FR); Celine Portemont, Semons (FR); Clarisse Ducruet, Grenoble (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days. days.

(21) Appl. No.: 13/604,035

(22) Filed: Sep. 5, 2012

(65) Prior Publication Data

US 2013/0234266 A1    Sep. 12, 2013

(30) Foreign Application Priority Data

Sep. 9, 2011   (EP) .................................... 11290402

(51) Int. Cl.

| | | |
|---|---|---|
| *H01L 29/82* | (2006.01) | |
| *G01R 33/09* | (2006.01) | |
| *G11C 11/16* | (2006.01) | |
| *H01L 43/08* | (2006.01) | |
| *H01L 21/02* | (2006.01) | |
| *B82Y 10/00* | (2011.01) | |
| *H01L 43/12* | (2006.01) | |

(Continued)

(52) U.S. Cl.
CPC .............. *H01L 29/82* (2013.01); *B82Y 10/00* (2013.01); *B82Y 40/00* (2013.01); *G01R 33/098* (2013.01); *G11C 11/16* (2013.01); *G11C 11/161* (2013.01); *G11C 11/1675* (2013.01); *H01F 41/307* (2013.01); *H01L 21/02104* (2013.01); *H01L 43/08* (2013.01); *H01L 43/12* (2013.01); *B82Y 25/00* (2013.01)

(58) Field of Classification Search
CPC ............. H01L 27/222; H01L 27/11502; H01L 29/784; H01L 43/08
USPC ............................................... 257/427; 438/3
See application file for complete search history.

(56) References Cited

U.S. PATENT DOCUMENTS

| | | | |
|---|---|---|---|
| 6,841,395 B2 | 1/2005 | Linn et al. | |
| 2002/0097534 A1* | 7/2002 | Sun ........................ | B82Y 10/00 360/324.2 |

(Continued)

FOREIGN PATENT DOCUMENTS

| | | |
|---|---|---|
| DE | 10309243 A1 | 9/2004 |
| EP | 1801895 A2 | 6/2007 |

OTHER PUBLICATIONS

Extended European Search Report dated Feb. 2, 2012 for application EP11290402.

*Primary Examiner* — Lex Malsawma
*Assistant Examiner* — Geoffrey Ida
(74) *Attorney, Agent, or Firm* — Pearne & Gordon LLP

(57) ABSTRACT

The present disclosure concerns a method of fabricating a magnetic tunnel junction suitable for a magnetic random access memory (MRAM) cell and comprising a first ferromagnetic layer, a tunnel barrier layer, and a second ferromagnetic layer, comprising: forming the first ferromagnetic layer; forming the tunnel barrier layer; and forming the second ferromagnetic layer; wherein said forming the tunnel barrier layer comprises depositing a layer of metallic Mg; and oxidizing the deposited layer of metallic Mg such as to transform the metallic Mg into MgO; the step of forming the tunnel barrier layer being performed at least twice such that the tunnel barrier layer comprises at least two layers of MgO.

12 Claims, 2 Drawing Sheets

(51) Int. Cl.
  *H01F 41/30* (2006.01)
  *B82Y 40/00* (2011.01)
  *B82Y 25/00* (2011.01)

(56) References Cited

U.S. PATENT DOCUMENTS

| | | | |
|---|---|---|---|
| 2004/0180237 A1* | 9/2004 | Drewes | H01L 27/222 |
| | | | 428/811.1 |
| 2005/0078418 A1* | 4/2005 | Saito et al. | 360/324.2 |
| 2006/0003185 A1 | 1/2006 | Parkin | |
| 2006/0227465 A1 | 10/2006 | Inokuchi et al. | |
| 2008/0299679 A1* | 12/2008 | Zhao et al. | 438/3 |
| 2009/0268351 A1* | 10/2009 | Zeltser | B82Y 10/00 |
| | | | 360/324.2 |
| 2011/0081732 A1* | 4/2011 | Choi | 438/3 |
| 2012/0288963 A1* | 11/2012 | Nishimura | 438/3 |

* cited by examiner

MAGNETIC TUNNEL JUNCTION WITH AN IMPROVED TUNNEL BARRIER

FIELD

The present invention concerns a method of fabricating a magnetic tunnel junction suitable for a magnetic random access memory (MRAM) cell having low defectivity and higher breakdown voltage.

BACKGROUND

FIG. 1 represents a conventional magnetic random access memory (MRAM) cell 1. The MRAM cell 1 comprises a magnetic tunnel junction 2 formed from a first ferromagnetic layer 21, a second ferromagnetic layer 23 and a tunnel barrier layer 22 having a junction resistance-area product RA. In the example of FIG. 1, the MRAM cell is intended to be written using a thermally assisted (TA) write operation and the magnetic tunnel junction 2 further comprises a second antiferromagnetic layer 25 exchange-coupling the second ferromagnetic layer 23. During the write operation, a heating current 32 can be passed, via a current line 4, in the magnetic tunnel junction 2 such as to heat the magnetic tunnel junction 2 at a high temperature threshold at which a magnetization of the storage can be freely switched. The first ferromagnetic layer 21 can have a magnetization being free to switch or also be exchanged-coupled by a first antiferromagnetic layer 24 such as to have a fixed magnetization.

The tunnel barrier layer 22 is often made from a magnesium oxide (MgO) layer. Indeed, large tunnel magnetoresistance (TMR) for example of up to 200% can be obtained for the magnetic tunnel junction 2 comprising a crystalline MgO-based tunnel barrier layer 22. Such tunnel barrier layer 22 made of MgO can be obtained by using an RF magnetron sputtering method. However, the MgO formation method by the RF magnetron sputtering can give rise to dispersion in normalized tunnel resistive value (RA) and possible deterioration of the yield factor at the time of device fabrication.

In U.S. Pat. No. 6,841,395, the MgO barrier layer is formed by a method comprising the steps film formation of a metal Mg layer, forming oxygen-doped metal Mg layers, and bringing the laminated layers into an oxidation process. However, during the step of oxidizing the Mg layer, defects such as pinholes can be formed on the MgO layer surface. Defects formation can arise due to the fact that the MgO oxide has a larger volume than metallic Mg. As a result, current leakage may occur yielding to a lower resistance and a lower breakdown voltage of the MgO tunnel barrier 22, especially for low RA values, below 50 ohm$\Box$m$^2$. Such current leakage can occurs when a current is passed in the magnetic tunnel junction 2 for heating the magnetic tunnel junction 2 during the TA write operation of the MRAM cell 1, or for reading the junction resistance during a read operation of the MRAM cell 1. The presence of defects can thus decrease the resistance of the MgO tunnel barrier 22, and the tunnel magnetoresistance TMR of the magnetic tunnel junction 2 comprising such MgO tunnel barrier 22 is also lowered. Moreover, a lower breakdown voltage of the barrier layer 22 can be observed.

Reducing the effect of pinholes requires having a relatively thick Mg layer and/or growing relatively thick oxide layers. Increasing the thickness of the MgO tunnel barrier layer may 22 can yield a RA that is too large so that the voltage for driving the magnetic tunnel junction device becomes too high. Also, if the initial Mg layer is too thick a single step oxidation is not oxidize completely this Mg layer. The Mg layer will then be under oxidized, with lower RA, lower TMR and lower breakdown voltage.

SUMMARY

The present disclosure concerns a method of fabricating a magnetic tunnel junction suitable for a magnetic random access memory (MRAM) cell and comprising a first ferromagnetic layer, a tunnel barrier layer, and a second ferromagnetic layer, comprising: forming the first ferromagnetic layer; forming the tunnel barrier layer; and forming the second ferromagnetic layer; wherein said forming the tunnel barrier layer comprises depositing a layer of metallic Mg; and oxidizing the deposited layer of metallic Mg such as to transform the metallic Mg into MgO; the step of forming the tunnel barrier layer being performed at least twice such that the tunnel barrier layer comprises at least two layers of MgO.

The method disclosed herein allows for forming the tunnel barrier having low defectivity and higher breakdown voltage compared to conventional tunnel barrier.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
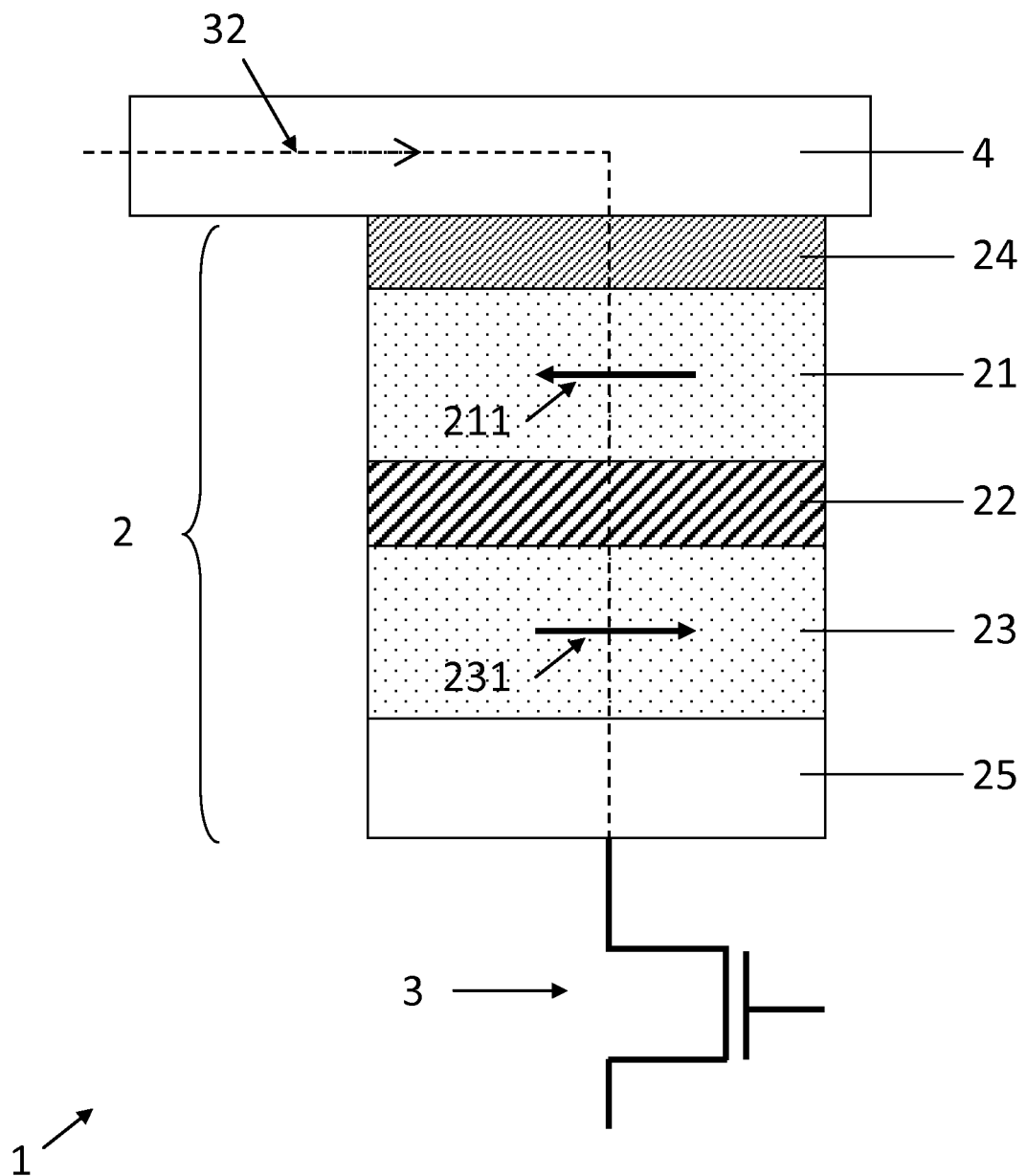
FIG. 1 shows a conventional magnetic random access memory (MRAM) cell comprising a magnetic tunnel junction.
Figure 2:
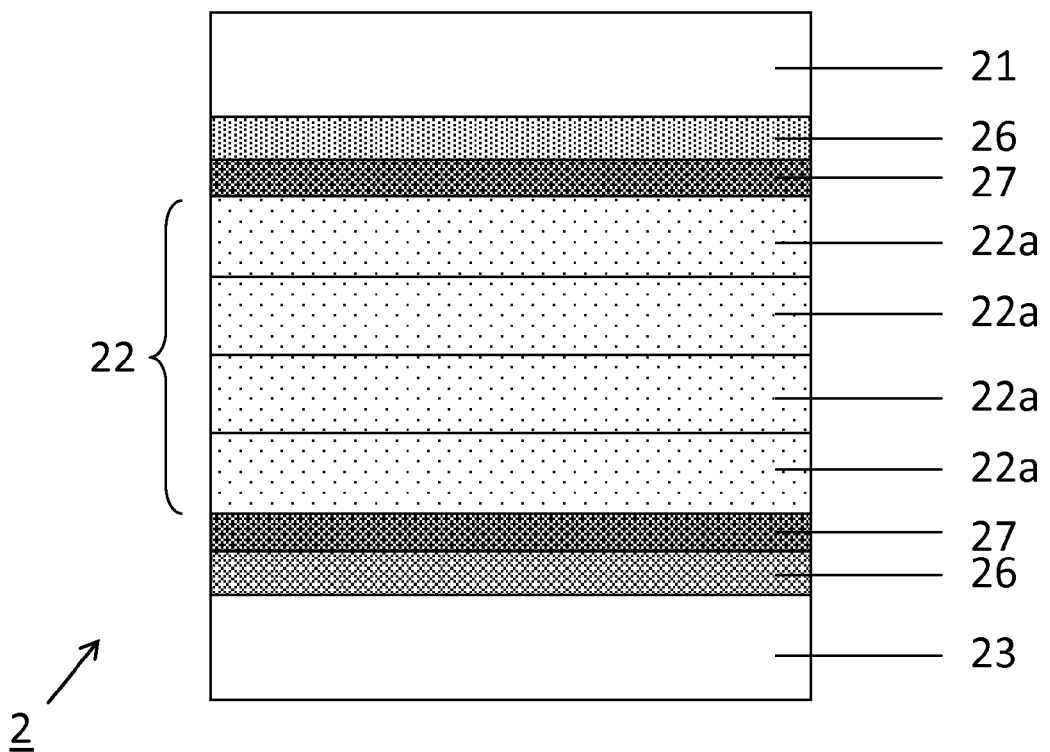
FIG. 2 illustrates a magnetic tunnel junction comprising a tunnel barrier layer according to an embodiment.

FIG. 2 illustrates a magnetic tunnel junction 2 of a magnetic random access memory (MRAM) cell according to an embodiment. The magnetic tunnel junction 2 comprises a first ferromagnetic layer 21, a tunnel barrier layer 22, and a second ferromagnetic layer 23. In the case MRAM cell is to be written with a thermally assisted switching (TAS) write operation, the magnetic tunnel junction 2 can comprise a first antiferromagnetic layer (not represented) exchange coupling the first ferromagnetic layer 21 such that the magnetization of the first storage layer 21 can be freely oriented at a first high temperature threshold, and pinned below this temperature. The magnetic tunnel junction 2 can further comprise a second antiferromagnetic layer (also not represented) exchange coupling the second ferromagnetic layer 23 such as to pin its magnetization at a second low temperature threshold and freeing it at a second high temperature threshold. The first and second antiferromagnetic layer can be made from a manganese-based alloy, such as IrMn, NiMn, PtMn or FeMn, or any other suitable materials.

The ferromagnetic material of the first and second ferromagnetic layers 21, 23 can comprise elements from the group consisting of cobalt Co, iron Fe, boron B, nickel Ni, e.g., nickel iron boron NiFeB, and preferably cobalt iron boron CoFeB, which provides excellent magnetoresistance (TMR) response. Preferably, the first and second ferromagnetic layers 21, 23 are made from a CoFeB-based alloy. The tunnel barrier layer 22 can be an insulating layer, for example, made from an oxide selected in the group including among others aluminum oxides $Al_2O_3$. Preferably, the tunnel barrier layer 22 is made of an MgO-based oxide. The use of a MgO-based oxide in the magnetic tunnel junction makes it possible to achieve an increase in the available magnetoresistive signal up to about 200% resistance change at room temperature (Parkin et. al., 2004, Nat. Mater. 3, 862).

According to an embodiment, a method of fabricating the magnetic tunnel junction 2 comprises:
  forming the first ferromagnetic layer 21;
  forming the tunnel barrier layer 22; and
  forming the second ferromagnetic layer 23;
  wherein said forming the tunnel barrier layer 22 comprises depositing a layer of metallic Mg; and oxidizing the deposited layer of metallic Mg such as to transform the metallic Mg into MgO and obtain a layer of MgO 22a. The step of forming the tunnel barrier layer 22 is performed at least twice such that the tunnel barrier layer 22 comprises at least two MgO layers 22a.

In an embodiment, forming the first and second ferromagnetic layers 21, 23 and depositing the layer of metallic Mg are performed by using a sputtering deposition method. The several deposition steps can be performed in the same sputtering chamber or in different sputtering chambers. Alternatively, several deposition steps are performed by using any other vacuum film deposition technique such as ion beam deposition or pulsed laser deposition. The layer of metallic Mg is preferably deposited with a thickness comprised between 0 and 1.5 nm, and preferably between 0.3 nm and 1.2 nm.

Oxidizing the deposited layer of metallic Mg such as to transform the metallic Mg into an MgO oxide can comprise oxidation by exposure to a plasma or to an oxygen flow (natural oxidation). There is an optimum thickness that can be oxidized with given oxidation conditions. For example, if the Mg layer is thicker than this optimum it will be under oxidized for those particular oxidation conditions (lower RA and lower TMR). If it is thinner, it will be over oxidized (higher RA and lower TMR). Here, a plasma which contains oxygen ions is applied to the layer of metallic Mg. Plasma oxidation can be performed with or without accelerating oxygen ions in a direction normal to the surface of the exposed layer of metallic Mg to implant the oxygen ions therein. The plasma oxidation can also be performed whether or not accompanied by directional acceleration for implantation. The plasma oxidation can be performed at or below room temperature. For more rapid and more thorough conversion of the metallic Mg into the MgO oxide, plasma oxidation can also be performed at elevated temperatures, as high as the integrity of the tunnel junction will allow (approximately 300-400° C.). In the plasma oxidation process the settings that govern oxidation are the ion energy (power applied with the plasma source), process time and the amount of oxygen injected in the chamber, typically, 500 sccm. This method is faster than natural oxidation process described below but may result in inserting some defects in the MgO layer. A possible way to limit the formation of defects in the MgO layer can comprise using a natural oxidation process. In the natural oxidation process, an amount of oxygen gas is introduced in the presence of Mg metallic layer and in that case, "time" and "pressure" are the only settings of the oxidation process. Typical process time range from 100 to 500 s and typical process pressure range from 0.1 to 50 Torr. The oxygen atoms migrate into the Mg layer and the MgO is formed until the passivation layer thickness is reached. An annealing process will reorganize or crystallize this MgO layer. Alternatively, oxidizing the deposited layer of metallic Mg can be performed by oxidizing the metal by a radical oxidation (ROX). The step of oxidizing the deposited layer of metallic Mg is typically performed in a different chamber than the sputtering chambers.

In an embodiment, depositing the layer of metallic Mg further comprises using an inert gas such as N during the deposition operation. The inert gas is advantageously used for leveling, or flattening, the layer of metallic Mg, and in avoiding a compression of the MgO molecules during the oxidizing step.

In another embodiment, the method further comprises the step of depositing an additional layer of metallic Mg 27 prior and after to forming the tunnel barrier layer 22. The additional layers of metallic Mg 27 are not oxidized such that, after fabricating the magnetic tunnel junction 2, the latter comprises the additional layer of metallic Mg 27 between the tunnel barrier layer 22 and the first ferromagnetic layer 21 and between the tunnel barrier layer 22 and the second ferromagnetic layer 23, the additional layers of metallic Mg 27 being adjacent to the tunnel barrier layer 22. The additional layers of metallic Mg 27 are advantageous in preventing migration of oxygen from the MgO tunnel barrier layer 22 into the first and/or second ferromagnetic layer 21, 23. The additional layers of metallic Mg 27 are preferably deposited with a thickness below about 0.5 nm.

In yet another embodiment, the method further comprises the step of depositing a $Co_xFe_{1-x}$ layer 26 after forming the first ferromagnetic layer 21 and prior to forming the second ferromagnetic layer 23. The magnetic tunnel junction 2 thus formed comprises the CoFe layers 26 between the first ferromagnetic layer 21 and the tunnel barrier layer 22 and between the multilayer barrier layer 22, and the second ferromagnetic layer 23. The CoFe layers 26 are typically deposited with a thickness of up to about 1 nm and preferably up to about 0.5 nm. The thin CoFe layers 26 are useful in preventing migration of B from the first and second ferromagnetic layer 21, 23 into the barrier layer 22.

Figure 3:
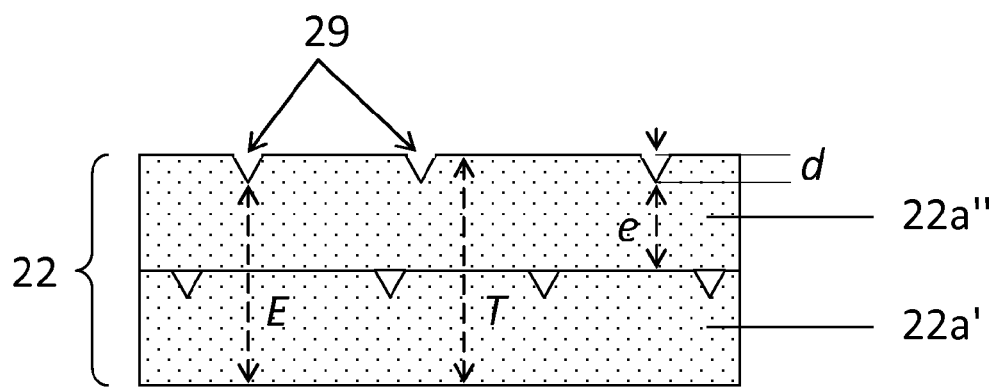
FIG. 3 represents tunnel barrier layer comprising two subsequently deposited layer of metallic Mg according an embodiment.

During the step of oxidizing the layer of metallic Mg, pinholes 29 (see FIG. 3) can be created in the forming of the MgO layer 22a. Here, the term pinholes can include any type of defects produced in the MgO layer 22a including a non-traversing cavities, crevices, traversing pores, or the like. Pinholes 29 are typically formed during the step of oxidation due to the fact that the MgO oxide has a larger volume than metallic Mg causing some expansion of the layer of MgO 22a. The final thickness of the MgO layer 22a can thus be locally smaller at the pinholes locations. Indeed, the effective thickness e of the MgO layer 22a corresponds to the thickness of the MgO layer 22a without pinhole minus the depth d of the pinhole 29, as illustrated in the example of FIG. 3.

Due to the MgO growth mechanisms during the oxidation process, the pinhole distribution is likely to vary from one MgO layer 22a to another. Consequently, when forming the multilayer barrier layer 22, very few or none of the pinholes 29 formed in the previously deposited MgO layer 22a' are aligned with the pinholes formed in the subsequently deposited MgO layer 22a". This is schematically illustrated in FIG. 3 showing two subsequently deposited and oxidized MgO layers 22a', 22a" according to the method described above. In this example, pinholes 29 formed on a firstly deposited MgO layer 22a' are not aligned with pinholes 29 formed on a secondly deposited MgO layer 22a".

The larger the number of deposited MgO layer 22a', 22a" forming the multilayered barrier layer 22, the lower the probability of the barrier layer 22 to comprise pinholes 29 being aligned through all MgO layers 22a and thus, the barrier layer 22 to comprise traversing pores.

This, in turn, can result in a lower breakdown voltage of the barrier layer 22. Reducing the effect of pinholes requires having a relatively thick Mg layer and/or growing relatively thick oxide layers.

Another advantage of the barrier layer 22 and the method of forming such barrier layer 22 is a leveling effect due to the plurality of MgO layers 22a. In FIG. 3, this leveling effect is illustrated by an effective thickness E of the multilayered barrier layer 22 corresponding to the cumulated thickness of the plurality of MgO layers 22a', 22a" minus the depth d of the pinhole 29 in the lastly deposited MgO layer 22a". From FIG. 3, it can be seen that increasing the number of deposited MgO layers 22a', 22a" reduces the ratio d/E of the pinhole depth d over the effective barrier layer thickness E (the effective barrier layer thickness E approach the thickness T of the barrier layer in the absence of pinhole). Consequently, the barrier layer 22 formed by the method disclosed herein has an effective barrier layer thickness E that is similar to the thickness T of the barrier layer in the absence of pinhole.

Increasing the number of deposited MgO layers 22a', 22a" diminishes the influence of the pinholes and allows for resistance of the multilayered barrier layer 22 and TMR of the magnetic tunnel junction 2 comprising the multilayered barrier layer 22 to be substantially similar to the ones obtained for a barrier layer 22 of same thickness without pinhole.

In an embodiment, the multilayered barrier layer 22 can be formed using the method disclosed herein having a higher breakdown voltage (more than 1V) than a conventional barrier layer 22 having a single MgO layer, for the same value of RA.

REFERENCE NUMBERS AND SYMBOLS

1 MRAM cell
2 magnetic tunnel junction
21 first ferromagnetic layer
22 tunnel barrier layer
22a Mg layer, MgO layer
23 second ferromagnetic layer
26 CoFe layer
27 additional Mg layer
29 pinholes
3 select transistor
d pinhole depth
e effective thickness of the Mg layer
E effective thickness of the barrier layer
T Thickness of the barrier layer without pinhole

The invention claimed is:

1. Method of fabricating a magnetic tunnel junction suitable for a magnetic random access memory (MRAM) cell and comprising a first ferromagnetic layer, a tunnel barrier layer, and a second ferromagnetic layer, comprising:
    forming the first ferromagnetic layer comprising elements from the group consisting of cobalt CO, iron Fe, boron B, and nickel Ni;
    depositing a first additional CoFe layer after forming the first ferromagnetic layer;
    forming the tunnel barrier layer;
    depositing a second additional CoFe layer prior to forming the second ferromagnetic layer; and
    forming the second ferromagnetic layer comprising elements from the group consisting of cobalt Co, iron Fe, boron B, and nickel Ni,
    such that the magnetic tunnel junction comprises the first additional CoFe layer between the first ferromagnetic layer and the tunnel barrier layer and the second additional CoFe layer between the tunnel barrier layer and the second ferromagnetic layer;
    said forming the tunnel barrier layer comprising the steps of:
        depositing a first layer of metallic Mg,
        subsequent to the deposition of the first layer of metallic Mg, oxidizing the deposited first layer of metallic Mg such as to transform the first layer of metallic Mg into a first layer of MgO,
        subsequent to transforming the first layer into MgO, depositing a second layer of metallic Mg on the first layer of MgO, and
        subsequent to depositing the second layer of metallic Mg, oxidizing the deposited second layer of metallic Mg such as to transform the second layer of metallic Mg into a second layer of MgO;
    whereby the steps of forming MgO layers are performed more than twice such that the tunnel barrier layer comprises more than two layers of MgO so as to reduce the probability of the barrier layer comprising pinholes which are aligned through all the MgO layers, wherein
    the steps of depositing the layer of metallic Mg further comprises using an inert gas such as to level the deposited layer of metallic Mg, the deposited layer of metallic Mg is between 0.3 nm and 1.2 nm.

2. The method according to claim 1, wherein the thickness of the deposited layer of metallic Mg is comprised between 0 nm and 1.5 nm and preferably between 0.3 nm and 1.2 nm.

3. The method according to claim 1, further comprising depositing an additional layer of metallic Mg prior and after forming the tunnel barrier layer.

4. The method of claim 1, wherein said Mg layer does not contain oxygen while being deposited using the inert gas.

5. The method of claim 4, where oxygen is introduced for performing said oxidation only after the layer of Mg is deposited.

6. The method of claim 1, where oxygen is introduced for performing said oxidation only after the layer of Mg is deposited.

7. Method of fabricating a magnetic tunnel junction suitable for a magnetic random access memory (MRAM) cell and comprising a first ferromagnetic layer, a tunnel barrier layer, and a second ferromagnetic layer, comprising:
    forming the first ferromagnetic layer comprising elements from the group consisting of cobalt Co, iron Fe, boron B and nickel Ni;
    depositing a first additional CoFe layer after forming the first ferromagnetic layer;
    forming the tunnel barrier layer by performing method including the steps of:
        depositing a first layer of metallic Mg using an inert gas resulting in the layer of metallic Mg forming without oxygen doping,
        subsequent to the deposition of the first layer of metallic Mg, introducing oxygen for oxidizing the deposited first layer of metallic Mg such as to transform the metallic Mg into MgO,
        depositing a second layer of metallic Mg on the first layer of MgO, and
        subsequent to depositing the second layer of metallic Mg, oxidizing the deposited second layer of metallic Mg such as to transform the second layer of metallic Mg into a second layer of MgO; whereby the steps of forming MgO layers are performed at least twice such that the tunnel barrier layer comprises a plurality of layers of MgO so as to reduce the probability of the barrier layer comprising pinholes which are aligned through all the MgO layers;

depositing a second additional CoFe layer prior to forming the second ferromagnetic layer; and forming the second ferromagnetic layer comprising elements from the group consisting of cobalt Co, iron Fe, boron B and nickel Ni, such that the magnetic tunnel junction comprises the first additional CoFe layer between the first ferromagnetic layer and the tunnel barrier layer and the second additional CoFe layer between the tunnel barrier layer and the second ferromagnetic layer.

8. The method according to claim 5, wherein the thickness of the deposited layer of metallic Mg is comprised between 0 nm and 1.5 nm and preferably between 0.3 nm and 1.2 nm.

9. The method according to claim 5, further comprising depositing a CoFe layer after said forming the first ferromagnetic layer and prior said forming the second ferromagnetic layer.

10. The method according to claim 5, further comprising depositing an additional layer of metallic Mg prior and after forming the tunnel barrier layer.

11. Method of fabricating a magnetic tunnel junction suitable for a magnetic random access memory (MRAM) cell and comprising a first ferromagnetic layer, a tunnel barrier layer, and a second ferromagnetic layer, comprising:

forming the first ferromagnetic layer comprising elements from the group consisting of cobalt Co, iron Fe, boron B and nickel Ni;

depositing a first additional CoFe layer after forming the first ferromagnetic layer;

forming the tunnel barrier layer;

depositing a second additional CoFe layer prior to forming the second ferromagnetic layer; and forming the second ferromagnetic layer comprising elements from the group consisting of cobalt Co, iron Fe, boron B and nickel Ni, such that the magnetic tunnel junction comprises the first additional CoFe layer between the first ferromagnetic layer and the tunnel barrier layer and the second additional CoFe layer between the tunnel barrier layer and the second ferromagnetic layer;

said forming the tunnel barrier layer comprising the steps of:

depositing a first layer of metallic Mg, subsequent to the deposition of the first layer of metallic Mg, oxidizing the deposited first layer of metallic Mg such as to transform the first layer of metallic Mg into a first layer of MgO, subsequent to transforming the first layer into MgO, depositing a second layer of metallic Mg on the first layer of MgO, and subsequent to depositing the second layer of metallic Mg, oxidizing the deposited second layer of metallic Mg such as to transform the second layer of metallic Mg into a second layer of MgO;

whereby the steps of forming MgO layers are performed more than twice such that the tunnel barrier layer comprises more than two layers of MgO so as to reduce the probability of the barrier layer comprising pinholes which are aligned through all the MgO layers, wherein depositing the layer of metallic Mg further comprises using an inert gas such as to level the deposited layer of metallic Mg.

12. Method of fabricating a magnetic tunnel junction suitable for a magnetic random access memory (MRAM) cell and comprising a first ferromagnetic layer, a tunnel barrier layer, and a second ferromagnetic layer, comprising:

forming the first ferromagnetic layer comprising elements from the group consisting of cobalt Co, iron Fe, boron B and nickel Ni;

depositing a first additional CoFe layer after forming the first ferromagnetic layer;

forming the tunnel barrier layer;

depositing a second additional CoFe layer prior to forming the second ferromagnetic layer; and forming the second ferromagnetic layer comprising elements from the group consisting of cobalt Co, iron Fe, boron B and nickel Ni, such that the magnetic tunnel junction comprises the first additional CoFe layer between the first ferromagnetic layer and the tunnel barrier layer and the second additional CoFe layer between the tunnel barrier layer and the second ferromagnetic layer;

said forming the tunnel barrier layer comprising the steps of:

depositing a first layer of metallic Mg, subsequent to the deposition of the first layer of metallic Mg, oxidizing the deposited first layer of metallic Mg such as to transform the first layer of metallic Mg into a first layer of MgO, subsequent to transforming the first layer into MgO, depositing a second layer of metallic Mg on the first layer of MgO, and subsequent to depositing the second layer of metallic Mg, oxidizing the deposited second layer of metallic Mg such as to transform the second layer of metallic Mg into a second layer of MgO;

whereby the steps of forming MgO layers are performed more than twice such that the tunnel barrier layer comprises more than two layers of MgO so as to reduce the probability of the barrier layer comprising pinholes which are aligned through all the MgO layers, wherein depositing the layer of metallic Mg further comprises using an inert gas such as to level the deposited layer of metallic Mg, and wherein the thickness of each one of the Mg layers is between 0.3 nm and 1.2 nm.

* * * * *